United States Patent [19]

Sud et al.

[11] Patent Number: 4,459,685
[45] Date of Patent: Jul. 10, 1984

[54] REDUNDANCY SYSTEM FOR HIGH SPEED, WIDE-WORD SEMICONDUCTOR MEMORIES

[75] Inventors: Rahul Sud; Kim C. Hardee, both of Colorado Springs, Colo.

[73] Assignee: Inmos Corporation, Colorado Springs, Colo.

[21] Appl. No.: 354,192

[22] Filed: Mar. 3, 1982

[51] Int. Cl.³ .............................................. G11C 11/40
[52] U.S. Cl. ...................................... 365/200; 371/10
[58] Field of Search .................. 365/200, 210; 371/10, 371/11, 8

[56] References Cited

U.S. PATENT DOCUMENTS

4,250,570  2/1981  Tsang et al. ......................... 365/200
4,346,459  8/1982  Sud et al. ............................. 365/200

Primary Examiner—Joseph A. Popek
Attorney, Agent, or Firm—Cook, Wetzel & Egan, Ltd.

[57] ABSTRACT

A redundancy system is described for a high speed, wide-word semiconductor memory having first and second arrays of regular memory cells. The system includes a plurality of spare columns of cells, half of which are located adjacent the first array and half of which are located adjacent the second array. The number of spare columns which are adjacent each array is equal to the number of regular columns which are simultaneously selectable by an address input. Circuitry is included for responding to an incoming address representative of a defective regular cell for selecting half the spare columns in the first array in lieu of the regular addressed columns therein, and for selecting half the spare columns in the second array in lieu of the addressed regular columns therein.

16 Claims, 7 Drawing Figures

SPARE DISABLE CIRCUIT

REDUNDANCY SYSTEM FOR HIGH SPEED, WIDE-WORD SEMICONDUCTOR MEMORIES

BACKGROUND OF THE INVENTION

This invention is generally directed to improvements in semiconductor memories, and particularly to a redundancy system for use in high speed, wide-word semiconductor memories.

It is well known in the art that the yields of semiconductor memories can be improved by including redundant memory cells within each memory. See, for example, U.S. Pat. No. 4,250,570. When the manufacturer's probe test has identified one or more defective cells in the main memory array, the redundant cells are programmed to respond to the addresses of the defective cells.

Among some of the problems redundancy can present to the designer is the compromise between performance and yield. As those skilled in the art are aware, certain types of redundancy schemes, particularly for very high speed, wide-word memories, can detract from the memory's access time. In addition, certain types of redundancy schemes do not provide their expected increases in yield. Accordingly, there is a need for an improved redundancy system which provides significant improvements in yield without detracting from performance, especially for memories with very high speed (45 nanosecond) access times.

Another problem with certain redundancy schemes is their potential for causing on-chip fuses to be inadvertently blown during memory power up. Such fuses are part of the redundancy system and are typically blown or left unblown during probe test to program redundant memory cells. Those fuses which are intended to be unblown can be inadvertently blown during power up by transient currents developed, for example, by the charging of parasitic capacitances. The inadvertent blowing of a fuse is clearly undesirable since it erroneously programs one or more redundant memory cells.

Accordingly, it is generally an object of the invention to provide an improved redundancy system for high speed semiconductor memories.

It is a more specific object of the invention to provide a redundancy system which is particularly adapted for use with a wide-word, high speed memory, and which provides significant improvements in yields without impairing the memory's performance.

It is another object of the invention to provide such a redundancy system which protects programming fuses from being inadvertently blown.

BRIEF DESCRIPTION OF THE FIGURES

The objects stated above and other objects of the invention are set forth more particularly in the following detailed description and in the accompanying drawings, of which.

DESCRIPTION OF THE PREFERRED EMBODIMENT

The redundancy system described herein is based on a number of factors which impact on circuit performance and yield. For example, there are a number of ways that a column can fail, but a fewer number of ways that a row can normally fail. The column failures involve up to seven critical masks as opposed to only three masks for rows. In addition, the minimum size defect necessary to cause failure of two adjacent columns is typically less than half as large as a defect which can cause failure of two adjacent rows. Hence, column redundancy will ordinarily provide a greater yield than row redundancy in a typical 16K static RAM (Random Access Memory).

Redundancy analysis for wide-word (multiple input-/output) memories involves considerations which are not pertinent to single I/O (input/output) circuits. For example, in a wide-word memory, data constituting one input address applied to input address pins causes selection of not merely a single column, but instead a group of columns, e.g. four columns, one column per input-output port.

The peculiarities of wide-word memories give rise to several options by which column redundancy may be implemented. One such option is to arrange the interconnection of the memory so that each spare column can replace any one of the regular columns. This approach provides the most efficient use of the chip area which is dedicated to the spare columns. However, the interconnects needed to connect a spare column to any of several data buses on the chip may consume a large amount of chip area and add significant parasitic loading to the data buses.

The option described above and three additional column redundancy options for a 4K by 4 static memory were analyzed for their yield improvement factors using a relatively simple statistical model based on a Poisson distribution of defects. The calculated yield factor for each option is plotted versus yield without redundancy in FIG. 1, to which reference is now made.

Figure 1:
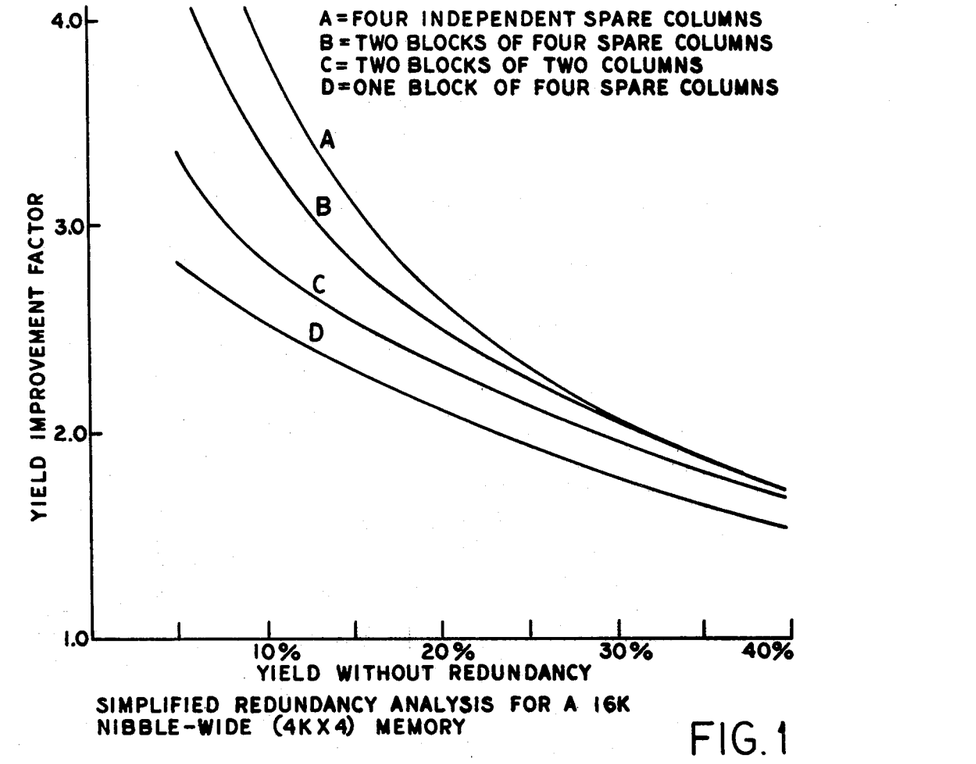
FIG. 1 is a plot of yield improvement factors versus yield without redundancy for four possible types of redundancy systems for use with a 16K (4K×4) semiconductor memory.

As shown in FIG. 1, plot A is for the case in which redundancy is implemented by four spare columns which can independently replace any four regular columns. This option provides the largest yield improvement of all the cases considered if the yield without redundancy is low. For higher yields (above 35%), however, the yield improvement for this option is theoretically less than the yield factor for option B, described below. Moreover the use of four independent spare columns requires the largest number of programming fuses and the most interconnect lines on the chip. Also, as stated above, the parasitic loading on the data lines impairs speed.

The redundancy scheme used herein is based on option B shown in FIG. 1, i.e., two blocks of four spare columns each. With this organization, two column addresses (actually four columns for each address) can be repaired. As shown, the yield factor for option B is very good at low yields (without redundancy) and as good or better than option A at higher yields. Moreover, only twelve programming fuses are required, and the interconnect and parasitic loading are reduced.

Options C and D in FIG. 1, two blocks of two spare columns and one block of four spare columns, respectively, each provide relatively low yield improvement factors and, therefore, are not considered further herein.

Based on the foregoing analysis, a memory having a pair of arrays of regular memory cells will have a redundancy system which includes a plurality of columns of spare memory cells, half of the spare columns being associated with one array and the other half of the spare columns being associated with the other array. The number of spare columns which are associated with each array of regular memory cells is equal to the number of regular columns which are simultaneously selectable. Thus, for a 4K×4 memory which is divided into a pair of arrays of regular memory cells, each array has a block of four spare columns. If any of the four selected regular columns (two in each array) has a defective cell, the two addressed columns in one array are replaced by two of the spare columns associated with that array. The two addressed columns in the other array are replaced by two spare columns associated with the latter array. The remaining spare columns will replace four other regular columns which include a defective cell.

The redundancy system described above is shown in block diagram form in FIG. 2 as configured for use with a 16K (4K×4) static RAM. The illustrated portion of the RAM includes a first array 10 of 64 regular columns of memory cells and a second array 12 also having 64 columns of regular memory cells. In response to an address input, two columns in the array 10 and two columns in the array 12 are simultaneously selected. The selected columns in the array 10, such as columns A and B, are coupled via access transistors 14 and 16 to sense amplifiers 18 and 20. The selected columns in the array 12, such as columns C and D, are coupled via access transistors 22 and 24 to sense amplifiers 26 and 28. Thus, the sense amplifiers 18, 20, 26 and 28 collectively provide a four bit output.

Figure 2:
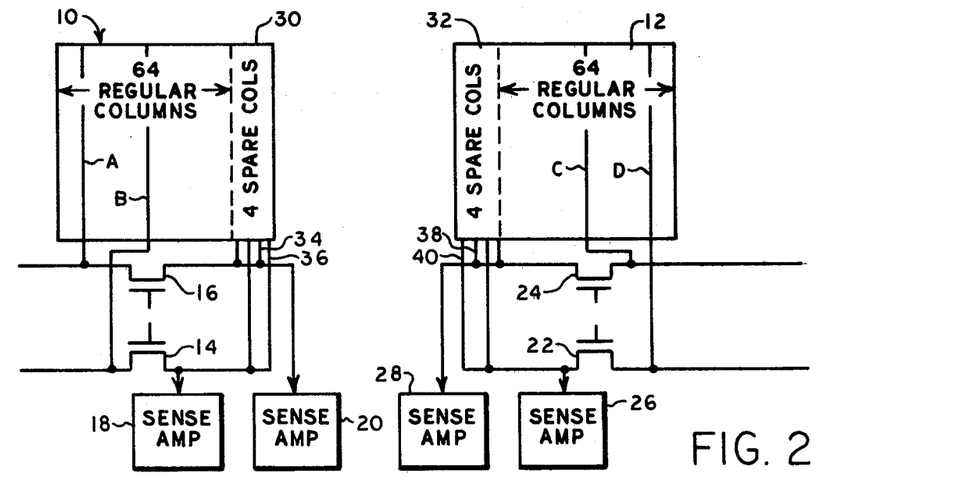
FIG. 2 is a block diagram of a redundancy system embodying various aspects of the invention.

Redundancy is provided by a block 30 of four spare columns adjacent the regular array 10 and by another block 32 of four spare columns adjacent the regular array 12. In the event that regular columns A, B, C and D are selected and that a defect exists in column C, for example, two spare columns in the block 30 are selected via leads 34 and 36 in place of columns A and B, and two spare columns in the block 32 are selected via leads 38 and 40 in place of columns C and D. Thus, if a defect is sensed in any one of the columns A, B, C or D, all four regular columns are replaced by two spare columns from each block of spares. In the present embodiment, the spare columns in block 30 replace only regular columns in the array 10, and the spare columns in block 32 replace only regular columns in the array 12.

Figure 3:
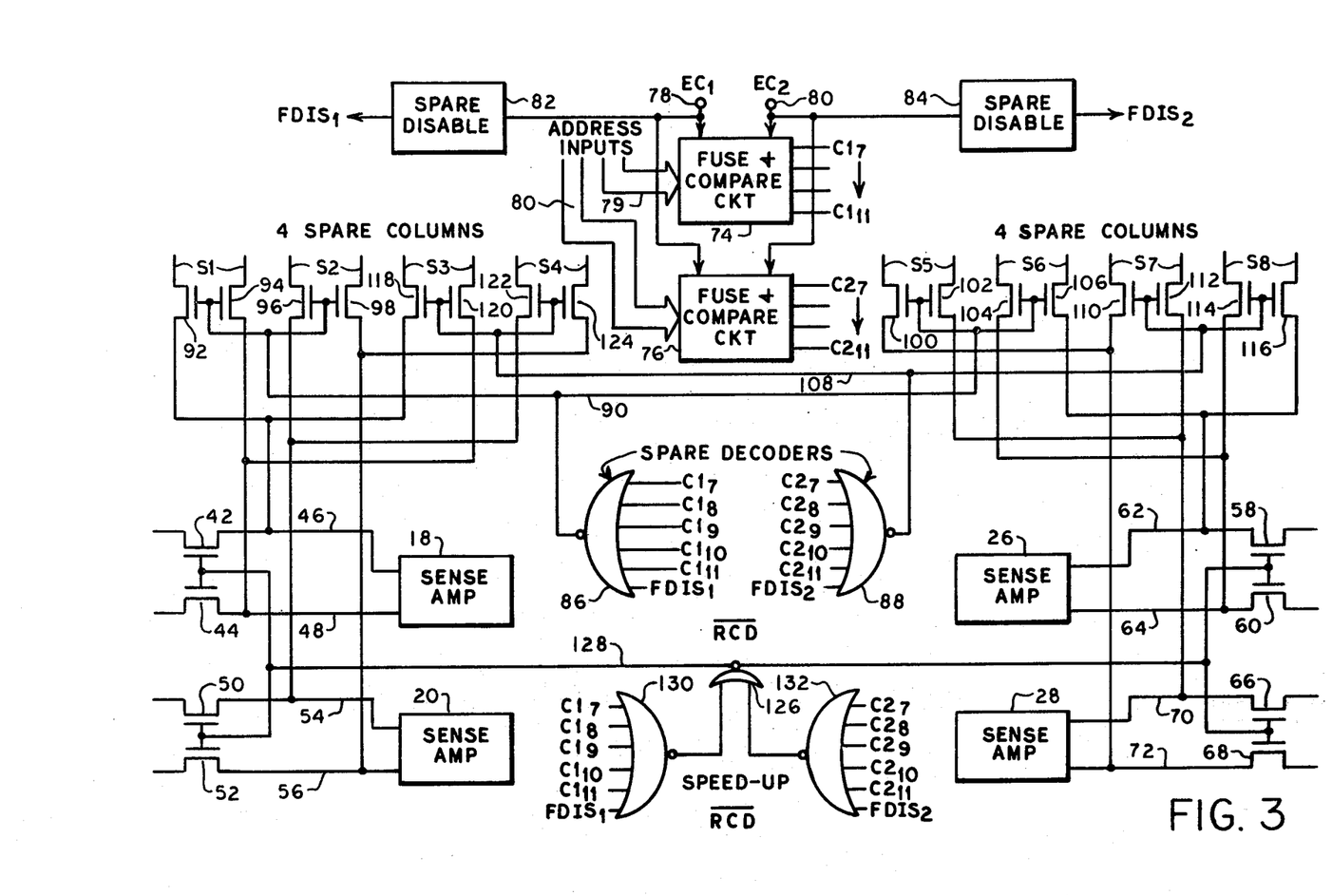
FIG. 3 is a circuit diagram showing a preferred embodiment of the redundancy system of FIG. 2.

Turning now to FIG. 3, a more detailed implementation of the preferred redundancy system is shown. In this figure, the four spare columns associated with spare block 30 are indicated as spare columns S1, S2, S3 and S4. The four spare columns associated with spare block 32 are indicated as spare columns S5, S6, S7 and S8. The regular arrays 10 and 12 are not shown in FIG. 3 as they may be conventional. Suffice it to say that regular columns in the array 10 are coupled to the sense amplifier 18 via transistors 42 and 44 and data lines 46 and 48, and are coupled to the sense amplifier 20 via transistors 50, 52 and data lines 54, 56. Likewise, the regular columns in the array 12 are coupled to the sense amplifier 26 via transistors 58, 60 and data lines 62, 64 and are coupled to the sense amplifier 28 via transistors 66, 68 and data lines 70, 72.

The memory undergoes a probe test by the manufacturer to detect defective cells. Assuming that one or more defective cells are found, the probe tester will apply electrical signals to the memory in order to store data indicative of the address of the defective cell. This data is typically stored by blowing programming fuses within the memory so that later incoming addresses can be automatically compared to the addresses stored by the fuses. Generally, when such a comparison indicates that a defective cell is being addressed a spare column is substituted for the column containing the defective cell.

The present embodiment includes a pair of fuse and compare circuits 74 and 76 for storing the addresses of defective columns and for comparing the stored address with incoming addresses. These fuse and compare circuits may be constructed as described in U.S. Pat. No. 4,346,459 entitled "Redundancy Scheme For An MOS Memory," owned by Inmos Corporation and incorporated herein by reference. As shown, the circuits 74 and 76 are coupled to pads 78 and 80 for receiving signals $EC_1$ and $EC_2$. These signals are generated by the probe tester to store the addresses of defective cells in the circuits 74 and 76. Address inputs are also coupled to the circuits 74 and 76 via busses 79 and 80 so that incoming addresses may be compared to the stored addresses of one or more defective columns.

If a defective column is being addressed in one of the regular arrays of cells, the outputs $C1_7$ through $C1_{11}$ of circuit 74 all go low. If a defective column in the other regular array is being addressed, the outputs $C2_7$ through $C2_{11}$ all go low. As described in detail below, four spare columns are selected and the originally selected columns are deselected when all the outputs of either of the fuse and compare circuits go low.

Also included are spare disable circuits 82 and 84. When probe test indicates that the memory has no defective cells, disable circuits 82 and 84 generate signals $FDIS_1$ and $FDIS_2$, respectively, to inhibit the selection of a spare column.

To select four spare columns in response to the outputs of the fuse and compare circuits, conventional spare decoders 86 and 88 are included. In response to all the signals $C1_7$ through $C1_{11}$ going low, the decoder 86 generates a high level signal on lead 90. Since the lead 90 is coupled to the gates of transistors 92, 94, 96 and 98, all these transistors are turned on to couple spare columns S1 to data lines 46 and 48 and to couple spare column S2 to data lines 54 and 56. Accordingly, the sense amplifiers 18 and 20 generate outputs consistent with selected data in spare columns S1 and S2.

The lead 90 is also coupled to the gates of transistors 100, 102, 104 and 106. Hence, the high level signal on the lead 90 turns on these four transistors to couple the spare column S5 to data leads 70 and 72, and to couple the spare column S6 to data lines 62 and 64. Thus, the sense amplifiers 26 and 28 generate outputs consistent with the selected data in columns S5 and S6.

The spare decoders 86 and 88 also receive the signals $FDIS_1$ and $FDIS_2$, respectively. When the memory has no defective memory cells, the spare enable circuits 82 and 84 drive these signals to a permanent high level for disabling the spare decoders 86 and 88.

When the signals $C2_7$ through $C2_{11}$ are all driven low by the fuse and compare circuit 76, the output of the spare decoder 88 drives a lead 108 high. As the lead 108 is coupled to the gates of transistors 110, 112, 114 and 116, all these transistors become conductive. Hence, spare column S7 is coupled via transistors 110, 112 and data lines 70, 72 to the sense amplifier 28. Likewise, the spare column S8 is coupled via transistors 114, 116 and data lines 62, 64 to the sense amplifier 26.

Two spare columns in the other spare block are also selected by the high level signal on lead 108. Since this lead is connected to the gates of transistors 118, 120, 122 and 124, all these transistors are turned on. Hence, the spare column S3 is coupled via transistors 118, 120 and data lines 46, 48 to the sense amplifier 18, and the spare column S4 is coupled via transistors 122, 124 and data lines 54, 56 to the sense amplifier 20. In this manner, two spare columns from each block of spares are selected in lieu of four addressed columns whenever an addressed column has a defective cell.

When spare columns are being selected, it is necessary, of course, to inhibit access to the main arrays of cells. In the illustrated embodiment, this is accomplished by means of a NOR gate 126 which develops a signal designated as $\overline{RCD}$ to the gates of transistors 42, 44, 50, 52, 58, 60, 66 and 68. In response to $\overline{RCD}$ being driven low by the gate 126, these transistors (42, 44, etc.) are turned off to disconnect the main arrays of memory cells from the data lines.

The gate 126 could be driven from the outputs of the spare decoders 86 and 88. However, the spare decoders typically operate too slowly for this purpose. Moreover, the gate 126 would add to the load on the outputs of the spare decoders to further reduce their operating speed. For this reason, the gate 126 is driven by the outputs of speed-up buffers 130 and 132. These buffers are especially designed to drive high the input to gate 126 whenever all their inputs ($C1_7$ through $C1_{11}$ and $C2_7$ through $C2_{11}$) from fuse and compare circuits 74, 76 go low. Thus, when all the outputs from either of the fuse and compare circuits go low, one of the high speed buffers 130, 132 develops a high output, whereupon $\overline{RCD}$ is driven low by the gate 126.

Another reason for the high speed buffers 130, 132 is that the slowest access to the regular arrays of cells occurs immediately after spare cells have been selected, i.e., going from a spare column access to a regular column access. When accessing the spare columns, $\overline{RCD}$ is low and must be driven high to access the regular columns. This entails an additional buffer delay provided by the gate 126 as compared to responding directly to incoming addresses, and can render the column access time somewhat longer than row access time. By driving the gate 126 by the high speed buffers 130, 132, this additional delay is minimized.

Figure 4:
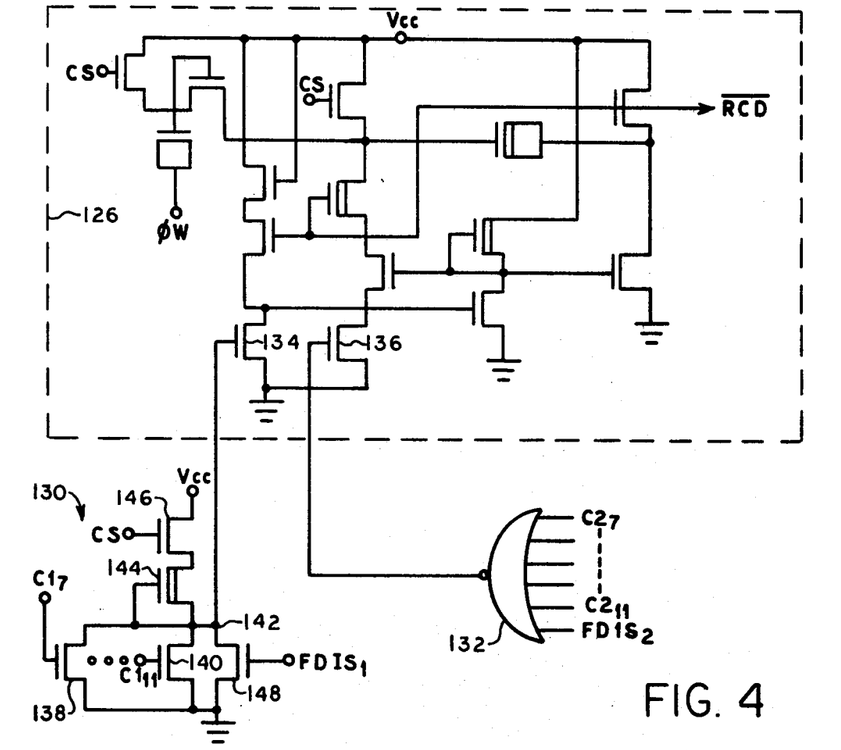
FIG. 4 is a more detailed diagram of the speed-up buffers and the NOR gate shown in FIG. 3.

Turning now to FIG. 4, the gate 126 and the high speed buffer 130 are shown in more detail. The high speed buffer 132 may be constructed similarly to the buffer 130.

The gate 126 is conventional and is shown as including a chip select (CS) input, a $\phi W$ clock input, an $\overline{RCD}$ output, and input transistors 134 and 136. Since the gate 126 is conventional, it need not be further described except to say that $\overline{RCD}$ is driven high when transistors 134 and 136 are turned off by buffers 130 and 132. When either of transistors 134, 136 are turned on, $\overline{RCD}$ is driven low to deselect the regular memory arrays.

Turning to buffer 130, it includes a plurality of five input transistors such as transistors 138 and 140, each of which receives one of the outputs ($C1_7$ through $C1_{11}$) from the fuse and compare circuit 74. The sources of these input transistors are grounded and their drains are coupled to a common node 142. A depletion transistor 144 has its gate and source coupled to node 142 to act as a load. Another transistor 146 is coupled via its source to the drain of transistor 144 and to Vcc via its drain. The gate of transistor 146 is adapted to receive a chip select (CS) input to power down the buffer.

With this arrangement, the potential on the node 142 is rapidly driven high when input signals $C1_7$ through $C1_{11}$ all go low. Consequently, transistor 134 in the gate 126 is turned on quickly to bring $\overline{RCD}$ to a low level. Conversely, when one of the input signals $C1_7$ through $C1_{11}$ remains high, node 42 is held low to turn off transistor 134 and drive $\overline{RCD}$ high to select the arrays of regular memory cells.

Also coupled to the node 142 is the drain of an additional transistor 148. This transistor has a grounded source and a gate adapted to receive $FDIS_1$ for holding low the potential at node 142 when the memory has no defective cells.

The buffer 132 operates similarly to the buffer 130 except, of course, that it responds to input signals $C2_7$ through $C2_{11}$ and $FDIS_2$.

By virtue of the construction described above, the buffers 130 and 132 operate substantially faster than conventional spare decoders 86 and 88 (FIG. 3). Hence, the state of the signal $\overline{RCD}$ can be changed significantly faster than if driven by the spare decoders.

As stated previously, redundancy systems which employ programmable fuses are subject to being improperly programmed under certain conditions. For example, transient currents developed during chip power up can blow a fuse which is intended to be unblown. The manner in which the present system overcomes this problem will now be addressed.

Figures 5, 6:
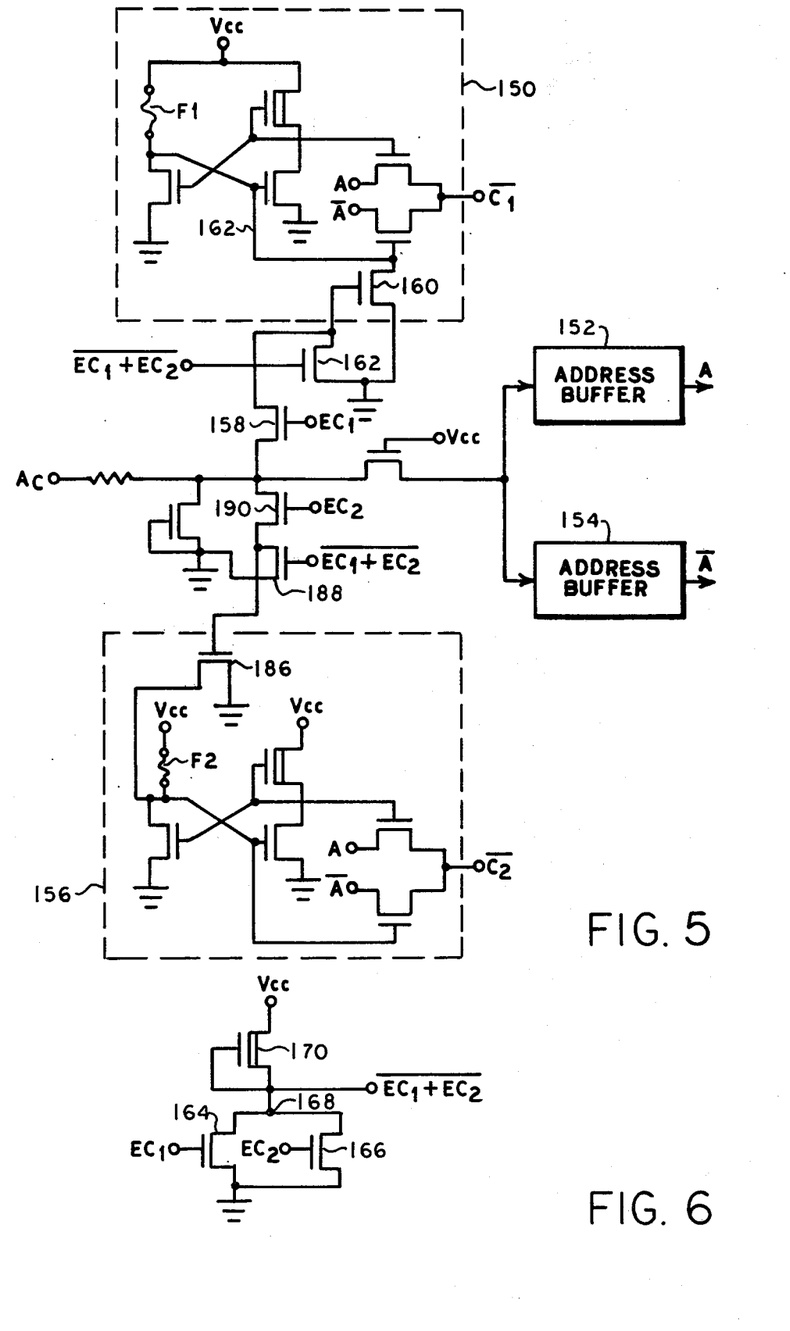
FIG. 5 illustrates portions of the fuse and compare circuits of FIG. 3 in more detail, including circuitry for protecting a programming fuse therein.
FIG. 6 is a diagram of a circuit for applying a logical OR function to the signals $EC_1$ and $EC_2$ referred to in FIG. 5.

Referring to FIG. 5, a programmable fuse F1 is shown as part of a programming element 150 which responds to the probe test signal $EC_1$ and address inputs A and $\overline{A}$ for developing an output designated as $\overline{C_1}$. The signals A and $\overline{A}$ are true and complementary addresses developed by conventional buffers 152 and 154 in response to a chip input address Ac. The element 150 is part of the fuse and compare circuit 74 (FIG. 3) and is constructed as described in U.S. Pat. No. 4,346,459. The output $\overline{C_1}$ of the element 150 corresponds to one of the outputs $C1_7$ through $C1_{11}$ of the fuse and compare circuit 74.

Another programming element 156 includes a fuse F2 and is part of the fuse and compare circuit 76. The element 156 causes the fuse F2 to be blown or unblown in response to the probe test signal $EC_2$ and the address inputs A and $\overline{A}$. Since the element 156 operates similarly to the element 150, only the latter element will be described in detail.

In operation, the fuse F1 is blown during probe test when the address input Ac is high and the signal $EC_1$ is high. This condition causes a transistor 158 to conduct for turning on a fuse blowing transistor 160. When the latter transistor conducts, current flows from Vcc through the fuse F1, through lead 162, and thence to ground through the transistor 160. The other transistors in the element 150 operate to determine the logic state of the output $\overline{C_1}$ by comparing the signals A and $\overline{A}$ to the state (blown or unblown) of the fuse F1.

The problem which can occur is that during power up the drain-to-gate capacitance of the transistor 160 can couple the increasing potential on lead 162 to the gate of transistor 160 such that this transistor is momentarily turned on. If the fuse F1 is narrow enough, the transistor 160 may conduct enough current to blow the fuse. The solution provided herein actively holds the transistor 160 off during power up and during normal memory operation to avoid blowing the fuse F1 inadvertently.

Toward this end, the probe test signal $EC_1$ is held low during power up and during normal memory operation while the gate of the fuse blowing transistor 160 is actively held low to prevent it from becoming conductive.

To hold the gate of transistor 160 low, that gate is coupled to the drain of another transistor 162 whose source is grounded and whose gate receives a signal $\overline{EC_1+EC_2}$. The latter signal is the logical NOR of the probe test signals $EC_1$ and $EC_2$, and may be developed as shown in FIG. 6.

As shown, the signal $EC_1$ is applied to the gate of a transistor 164 while the signal $EC_2$ is applied to the gate of a transistor 166. The sources of both these transistors are grounded and their drains are coupled to a node 168. A depletion mode transistor 170 is coupled as shown between Vcc and the node 168 to act as a load. With this arrangement, the signal at node 168 corresponds to the logical NOR of $EC_1$ and $EC_2$.

The signals $EC_1$ and $EC_2$ are high, if ever, only during probe test and low at all other times. Hence, the signal $\overline{EC_1+EC_2}$ remains high during power up and during normal memory operation.

Returning to FIG. 5, the signal $\overline{EC_1+EC_2}$ is applied to the gate of transistor 162. Accordingly, this transistor is held on during power up and normal memory operation, wherefore the gate of the transistor 160 is held low during the same times. Inadvertent turn-on of the transistor 160 is thus avoided and the fuse F1 is protected.

Figure 7:
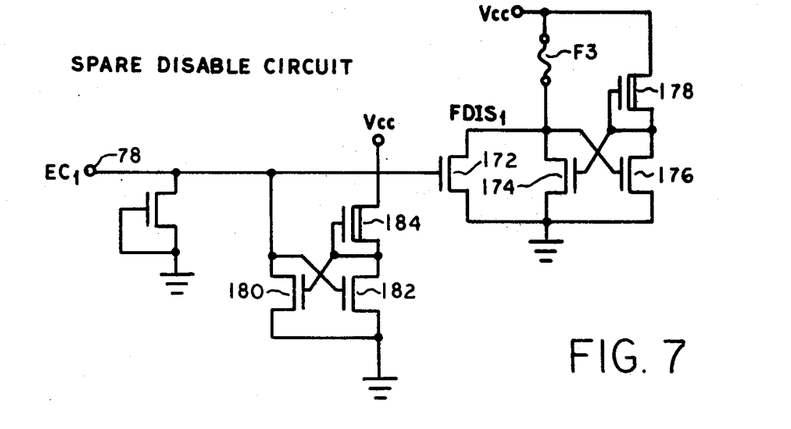
FIG. 7 illustrates exemplary circuitry for implementing the spare disable circuits shown in FIG. 3.

To hold the signal $EC_1$ (and $EC_2$) low during power up and normal memory operation, the circuitry shown in FIG. 7 may be used. This circuitry corresponds to the spare disable circuit 82 (FIG. 3) and includes a fuse F3 and transistors 172 through 178 for blowing the fuse F3 in response to the signal $EC_1$ and for latching the signal $FDIS_1$ in a state which corresponds to the state of the fuse F3.

To hold the signal $EC_1$ low during power up and during normal memory operation, a transistor latch comprising transistors 180, 182 and 184 is included. Except during probe test, the input signal $EC_1$ will normally float. However, with the drain of transistor 180 and the gate of transistor 182 coupled to the input terminal 78, the signal $EC_1$ is actively held low except when driven high by a probe tester.

Returning to FIG. 5, the signal $EC_1$ is coupled to the gate of transistor 158 to hold this transistor off during power up and during normal memory operation. Hence, the gate of transistor 160 is then decoupled from the address input Ac.

A circuit similar to that shown in FIG. 7 will normally be included in the spare disable circuit 84 to hold $EC_2$ low and to develop the signal $FDIS_2$.

Referring to the programming element 156, its fuse blowing transistor 186 is coupled via its gate to the drain of another transistor 188, the gate of the transistor 188 receives the signal $\overline{EC_1+EC_2}$ for holding low the potential on the gate of transistor 186 during power up and during normal memory operation. In addition, the gate of another transistor 190 receives the signal $EC_2$ for decoupling the address input Ac from the transistor 186.

From the foregoing description, it will be appreciated that the present redundancy system is particularly useful for high speed, wide-word semiconductor memories. The two blocks of four spare columns and their associated circuitry consume only about four percent of the total chip area. In addition, significant improvement in yields are provided without impairing the memory's performance. The fuse protection provided by the system also enhances the reliability of the memory.

Although the invention has been described in terms of preferred structure, it will be obvious to those skilled in the art that many alterations and modifications may be made thereto without departing from the invention. Accordingly, it is intended that all such alterations and modifications be considered as within the spirit and scope of the invention as defined by the appended claims.

What is claimed is:

1. In a high speed, wide-word semiconductor memory having first and second arrays of regular memory cells, having column select circuitry for selecting a predetermined number of addressed columns of cells in the first array and for simultaneously selecting an equal number of addressed columns of cells in the second array to develop a multi-bit output, a redundancy system for the memory comprising:
   a plurality of spare columns of memory cells, half of the spare columns being located adjacent the first array and half being located adjacent the second array, the number of spare columns which are adjacent each memory array being equal to the number of regular columns which are simultaneously selectable by the column select circuitry; and
   circuit means responsive to an incoming address being that of a defective cell for selecting half the spare columns adjacent the first array in lieu of the addressed columns in the first array and for selecting half the spare columns adjacent the second array in lieu of the addressed columns in the second array.

2. A redundancy system as set forth in claim 1 wherein the memory includes a group of four spare columns of cells adjacent the first memory array and a group of four spare columns of cells adjacent the second memory array, and wherein two spare columns from each group are selected in response to an incoming address being that of a defective regular cell.

3. A redundancy system as set forth in claim 1 wherein said circuit means includes:
   a first spare decoder for selecting half of the spare columns adjacent the first array and for simultaneously selecting half of the spare columns adjacent the second array in response to an incoming address being that of a defective regular cell; and
   a second spare decoder for selecting the remaining half of the spare columns adjacent the first array and for simultaneously selecting the remaining half of the spare columns adjacent the second array in response to a different incoming address being that of a defective regular cell.

4. A redundancy system as set forth in claim 3 wherein said circuit means further includes:
   a first speed-up buffer responsive to an incoming address being that of a defective regular cell in the first array for rapidly developing a first buffer output signal, and responsive to an incoming address being that of an operative regular cell for rapidly developing a second buffer output signal;

a second speed-up buffer responsive to an incoming address being that of a defective regular cell in the second array for rapidly developing a buffer output signal, and responsive to an incoming address being that of an operative regular cell for rapidly developing a second buffer output signal; and gate means responsive to the first buffer output signals for developing a disable signal to inhibit selection of regular cells, and responsive to the second buffer output signals for developing an enable signal to permit selection of regular cells.

5. A redundancy system as set forth in claim 4 wherein said first and second speed-up buffers each includes:

a plurality of input transistors each having a drain, a gate, and a grounded source, the drains thereof being coupled to a common node and each gate thereof being adapted to receive a signal indicative of part of the address of an addressed cell such that when the total address corresponds to that of an operative memory cell, at least one of the input transistors conducts to pull down the potential at the common node, the pulled down potential corresponding to said second buffer output signal, and when the total address corresponds to that of an inoperative cell, all input transistors remain nonconductive such that the potential at the common node corresponds to the first buffer output signal;

a load transistor coupled to the common node; and means for coupling the potential at the common node to said gate means.

6. A redundancy system as set forth in claim 5 wherein each speed-up buffer also includes a further transistor having a drain coupled to the common node, having a grounded source, and having a gate adapted to receive a spare disable signal so that, upon the occurrence of the spare disable signal, the potential at the common node is held low so that said gate means permits access to the arrays of regular memory cells.

7. A redundancy system as set forth in claim 1 wherein the memory includes programming fuses adapted to be selectively blown in response to voltages carried by probe test lines for identifying defective cells, and further including fuse protection means responsive to said voltages for inhibiting fuse blowing during power up of the memory and during normal memory operation.

8. A redundancy system as set forth in claim 7 wherein the memory includes fuse blowing transistors and wherein said fuse protection means includes:

means for holding the voltages on the probe test lines at low potentials during memory power up and during normal memory operation;

means for logically ORing the voltages on the probe test lines; and transistor means responsive to the ORed voltages for inhibiting conduction of the fuse blowing transistors.

9. In a high speed, wide-word semiconductor memory having first and second arrays of regular memory cells, having column select circuitry for selecting a predetermined number of addressed columns of cells in the first array and for simultaneously selecting an equal number of addressed columns of cells in the second array to develop a multi-bit output, a redundancy system for the memory comprising:

a first group of four spare columns of memory cells associated with the first array of regular memory cells, and a second group of four spare columns of memory cells associated with the second array of regular memory cells;

a first spare decoder for selecting two columns in the first group of spare columns and for selecting two columns in the second group of spare columns in response to an incoming address being that of a defective regular cell in one of the four addressed regular columns of cells;

a second spare decoder for selecting a different two columns in the first group of spare columns and for selecting a different two columns in the second group of spare columns in response to a different incoming address being that of a defective cell in one of four addressed regular columns of cells;

a first speed-up buffer responsive to an incoming address being that of a defective regular cell in the first array for rapidly developing a first buffer output signal, and responsive to an incoming address being that of an operative regular cell for rapidly developing a second buffer output signal;

a second speed-up buffer responsive to an incoming address being that of a defective regular cell in the second array for rapidly developing a buffer output signal, and responsive to an incoming address being that of an operative regular cell for rapidly developing a second buffer output signal; and gate means responsive to the first buffer output signals for developing a disable signal to inhibit selection of regular cells, and responsive to the second buffer output signals for developing an enable signal to permit selection of regular cells.

10. In a semiconductor memory having a plurality of columns of regular memory cells having programming fuses adapted to be selectively blown by fuse blowing transistors in response to voltages on probe test lines, a redundancy system comprising:

a plurality of spare columns of memory cells;

means for selecting spare columns of cells in lieu of regular columns of cells in response to address inputs corresponding to fused addresses of defective memory cells; and fuse protection means including transistor means whose source-drain path couples the gate of a fuse blowing transistor to ground and whose gate is coupled to receive a logical signal representative of the power-up, normal operation, or probe test status of the memory.

11. A redundancy system as set forth in claim 10 wherein said fuse protection means includes:

latch means for holding the voltages on the probe test lines low during memory power up and during normal memory operation; and means for logically ORing the voltages on the probe test lines; said transistor means being responsively coupled to the ORed voltages for inhibiting conduction of the fuse blowing transistors.

12. A redundancy system for a wide-word memory having first and second arrays of regulary memory cells wherein a predetermined number of columns of cells are addressed from both of said arrays simultaneously to develop a multi-bit output, the redundancy system comprising:

a plurality of spare columns of memory cells; and circuit means responsive to an address signal of a defective regular cell for selecting plural spare columns in lieu of the addressed columns of the first and second array.

13. the redundancy system of claim 12 wherein half of said spare columns are associated with the first array and half of said spare columns are associated with the second array, and wherein, said circuit means selects equal numbers of spare columns associated with the first and second arrays.

14. The redundancy system of claim 13 wherein the number of spare columns associated with said first array is equal to or greater than the number of regular columns which are simultaneously selectable.

15. The redundancy system of claim 14 wherein the number of spare columns associated with said first array is equal to the number of spare columns associated with said second array, and wherein said circuit means is coupled to select half of the spare columns of the first and second arrays.

16. The redundancy system of claim 14 wherein the spare columns associated with the first and second arrays, are located, respectively, adjacent thereto.

* * * * *